(12) United States Patent
Van Der Werf et al.

(10) Patent No.: US 7,505,116 B2
(45) Date of Patent: *Mar. 17, 2009

(54) LITHOGRAPHIC APPARATUS AND DEVICE MANUFACTURING METHOD

(75) Inventors: Jan Evert Van Der Werf, Waalre (NL); George Arie Jan Fockert, Apeldoorn (NL); Hans Van Der Laan, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 68 days.

This patent is subject to a terminal disclaimer.

(21) Appl. No.: 11/202,195

(22) Filed: Aug. 12, 2005

(65) Prior Publication Data

US 2005/0280795 A1  Dec. 22, 2005

Related U.S. Application Data

(63) Continuation of application No. 10/618,264, filed on Jul. 14, 2003, now Pat. No. 6,963,391.

(30) Foreign Application Priority Data

Jul. 16, 2002  (EP) .................................. 02255002

(51) Int. Cl.
G03B 27/54 (2006.01)
G03B 27/42 (2006.01)
G01B 11/00 (2006.01)

(52) U.S. Cl. .............................. 355/67; 355/53; 356/401

(58) Field of Classification Search .................. 355/67, 355/53, 55, 57, 66, 72, 75, 77; 356/399, 356/400, 401; 378/34, 84

See application file for complete search history.

(56) References Cited

U.S. PATENT DOCUMENTS

| 4,613,230 | A | 9/1986 | Iwai |
| 4,856,905 | A | 8/1989 | Nishi |
| 5,229,872 | A | 7/1993 | Mumola |
| 5,296,891 | A | 3/1994 | Vogt et al. |
| 5,485,272 | A | 1/1996 | Dirksen et al. |
| 5,523,193 | A | 6/1996 | Nelson |
| 5,969,441 | A | 10/1999 | Loopstra et al. |

(Continued)

FOREIGN PATENT DOCUMENTS

JP  04-045512  2/1992

(Continued)

OTHER PUBLICATIONS

Japanese Office Action issued for Japanese Patent Application No. 2003-294733, dated May 2, 2007.

(Continued)

*Primary Examiner*—Peter B Kim
(74) *Attorney, Agent, or Firm*—Sterne, Kessler, Goldstein & Fox P.L.L.C.

(57) ABSTRACT

A reflector alignment system uses an alignment beam propagating through a projection system that includes a mirror group to measure the apparent relative positions of two reference marks fixed to a reference frame on opposite sides of the projection system. Any movement of mirrors in the projection system will be detected as a shift in the apparent position of the reference marks.

13 Claims, 3 Drawing Sheets

U.S. PATENT DOCUMENTS

| | | | |
|---|---|---|---|
| 6,046,792 | A | 4/2000 | Van Der Werf et al. |
| 6,142,641 | A | 11/2000 | Cohen et al. |
| 6,151,120 | A | 11/2000 | Matsumoto et al. |
| 6,208,707 | B1 | 3/2001 | Oshino |
| 6,249,336 | B1 | 6/2001 | Ota |
| 6,262,796 | B1 | 7/2001 | Loopstra et al. |
| 6,963,391 | B2 * | 11/2005 | Van Der Werf et al. ....... 355/67 |
| 2001/0046037 | A1 * | 11/2001 | Ota et al. ...................... 355/53 |
| 2004/0032575 | A1 | 2/2004 | Nishi et al. |

FOREIGN PATENT DOCUMENTS

| | | |
|---|---|---|
| JP | 04-095908 | 3/1992 |
| JP | 5-160001 | 6/1993 |
| JP | 06-163366 | 6/1994 |
| JP | 07-066111 | 3/1995 |
| JP | 09-153444 | 6/1997 |
| JP | 11-233416 | 8/1999 |
| JP | 2000-286189 | 10/2000 |
| WO | WO 98/33096 A1 | 7/1998 |
| WO | WO 98/38597 A2 | 9/1998 |
| WO | WO 98/38597 A3 | 9/1998 |

OTHER PUBLICATIONS

Chaudhuri et al., "Alignment of a multilayer-coated imaging system using extreme ultraviolet Foucault and Ronchi interferometric testing," *J. Vac. Sci. Technol. B* 13(6):3089-3093 (1995), XP 000558379.

Vaidya et al., "Extreme Ultraviolet Lithography for 0.1 μm Devices," *VLSI Technology, Systems and Applications,* 1999. International Symposium on Taipei, Taiwan, Jun. 8-10, 1999, Piscataway, NJ, pp. 127-130, XP 10347511.

European Search Report, App. No. EP 02 25 5002, mailed Apr. 17, 2003, 4 pgs.

European Search Report, App. No. EP 03 25 4435, mailed Oct. 24, 2003, 4 pgs.

* cited by examiner

LITHOGRAPHIC APPARATUS AND DEVICE MANUFACTURING METHOD

CROSS REFERENCES TO RELATED APPLICATIONS

This application is a continuation of U.S. application Ser. No. 10/618,264, filed Jul. 14, 2003, now U.S. Pat. No. 6,963,391 that issued Nov. 8, 2005, which claimed priority to European Application 02255002.4, filed Jul. 16, 2002, the entire contents of both of which are incorporated herein by reference.

BACKGROUND OF THE INVENTION

1. Field of the Invention

The present invention relates to a lithographic apparatus and a device manufacturing method.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support may be embodied as a frame or table, for example, which may be fixed or movable as required.

Another example of a patterning device is a programmable LCD array. An example of such a construction is given in U.S. Pat. No. 5,229,872. As above, the support in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc.

Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. Nos. 5,969,441 and 6,262,796.

To meet the ever-present demand to be able to image smaller features, lithographic apparatus using extreme ultraviolet (EUV) radiation, e.g. with a wavelength in the range of from 5 to 20 nm, are being developed. Because no material suitable for making refractive optical elements for EUV radiation is known, EUV lithography machines must use a reflective optical system to project the mask image onto a substrate. The positional accuracy, and to a lesser extent the quality, of images projected by reflective optical systems are, by the nature of these systems, very sensitive to errors and disturbances in the relative and absolute positions of the reflectors in the optical system. Accordingly it is necessary to mount the reflectors in the projection system of a lithography system very accurately and stably. However, the stability of mounting of the reflectors cannot be relied upon and it is therefore necessary to be able to detect errors and disturbances of the reflector positions. Such errors and disturbances can be detected in the developed images projected onto substrates or using a transmission image sensor (TIS) in place of the substrate but this is time consuming and only provides a delayed indication of any problem.

SUMMARY OF THE INVENTION

It is an aspect of the present invention to provide a lithographic projection apparatus having an improved system to detect positional errors and disturbances of the reflectors in a projection system, preferably in real-time or near real-time.

This and other aspects are achieved according to the invention in a lithographic apparatus including an illuminator configured to supply a beam of radiation; a support configured to hold a patterning device, the patterning device configured to pattern the beam according to a desired pattern; a substrate table configured to hold a substrate; a projection system, comprising a plurality of reflectors, configured to project the patterned beam onto a target portion of the substrate; and a reflector alignment system configured to direct an alignment beam of radiation through the projection system to measure the apparent relative positions of a first reference mark provided in a fixed position on a patterning device side of the projection system and a second reference mark provided in a fixed position on a substrate side of the projection system.

By measuring the apparent relative positions of two fixed reference marks using a beam that propagates through the projection system, a direct and real-time measurement of the positions of the reflectors in the projection system is possible. Any movement of one or more reflectors will result in a shift in the apparent relative positions of the reference marks. The only delay in the measurement will be signal processing delays, which are small compared to the expected frequencies of disturbances of the reflectors.

The numeric aperture (NA) of the reflector alignment system may be smaller than that of the projection system so that the reference marks (or folding mirrors used to direct the alignment beam) can be positioned outside the object and image fields of the projection lens and do not interfere with the exposure.

The reflector alignment system may be of a through-the-lens (TTL) alignment between reference marks in the mask (patterning device) and on the substrate with additional optics to direct the alignment beam to and from the fixed reference marks. Such systems are tried and tested and may be rapidly implemented in the invention. The additional optics required may be two folding mirrors. If an alignment system requiring a relative scan of the reference marks to operate is used, one of the marks may be implemented as a running fringe pattern formed by interference between two beams intersecting at a small angle. Alternatively, the reference and detection gratings can be given slightly different periods so that a beat pattern is generated. The phase of the beat pattern will depend on the relative position of the two gratings and can be detected, e.g. with a CCD. In a further alternative, the ordinary (o) and extraordinary (e) components of the radiation are separated to fall on the detection grating at slightly different positions and a modulator between the detection grating and sensor transmits the o and e components alternately. The difference between o and e signals gives information about the relative position of the reference and detection gratings.

The fixed reference marks may be provided in planes congruent with the object and image planes of the projection system, where the patterning device and substrate are located during an exposure, so that the measured positional error directly corresponds to the error that will occur in the projected image.

One such reflector alignment system can be used to measure lateral shifts in X- and Y-directions while two such reflector alignment systems can be used to measure rotation and magnification changes as well as lateral shifts.

The errors detected by the reflector alignment system may be compensated for, in most cases (e.g. where they result in a simple translation or rotation of the image), by adjustment of the position and/or orientation of the patterning device, the substrate and/or one or more of the reflectors in the projection system. If the projection system is non-telecentric, magnification errors may also be compensated for in the same way.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm), as well as particle beams, such as ion beams or electron beams.

BRIEF DESCRIPTION OF THE DRAWINGS

Embodiments of the present invention will now be described, by way of example only, with reference to the accompanying schematic drawings in which.

In the Figures, corresponding reference symbols indicate corresponding parts.

DETAILED DESCRIPTION

Figure 1:
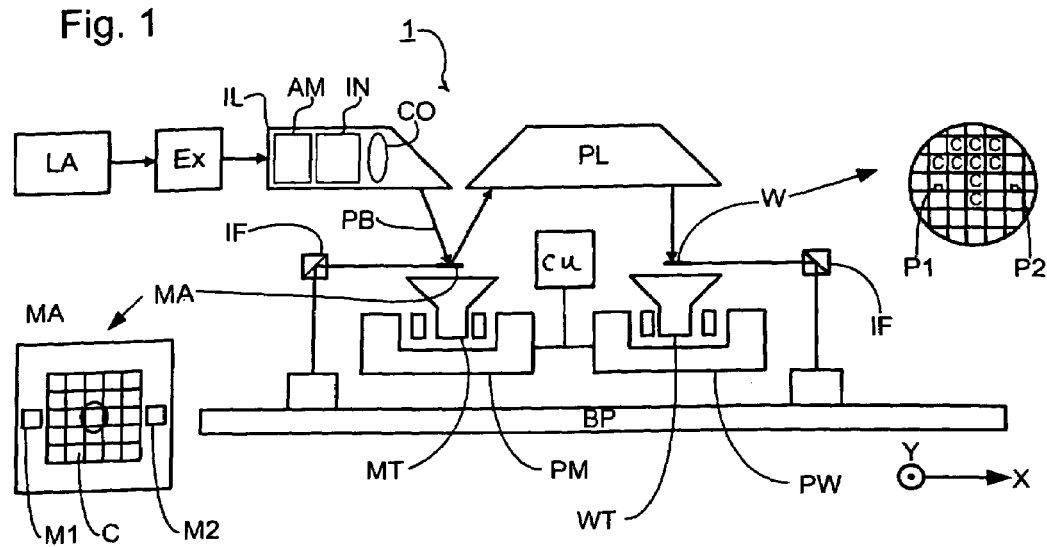
FIG. 1 depicts a lithographic projection apparatus according to an embodiment of the present invention.

FIG. 1 schematically depicts a lithographic projection apparatus 1 according to an embodiment of the invention. The apparatus 1 includes a base plate BP. The apparatus 1 may also include a radiation source LA (e.g., an EUV source). A first object (mask) table MT is provided with a mask holder (support) configured to hold a mask MA (e.g. a reticle), and is connected to a first positioning device PM that accurately positions the mask with respect to a projection system or lens PL. A second object (substrate) table WT is provided with a substrate holder configured to hold a substrate W (e.g. a resist-coated silicon wafer), and is connected to a second positioning device PW that accurately positions the substrate with respect to the projection system PL. The projection system or lens PL (e.g. a mirror group) is configured to image an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example with a transmissive mask. Alternatively, the apparatus may employ another kind of patterning device, such as a programmable mirror array of a type as referred to above.

The source LA (e.g. a discharge or laser-produced plasma source) produces radiation. This radiation is fed into an illumination system (illuminator) IL, either directly or after having traversed a conditioning device, such as a beam expander Ex. The illuminator IL may comprise an adjusting device AM that sets the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus, as is often the case when the source LA is a mercury lamp, for example, but that it may also be remote from the lithographic projection apparatus. The radiation beam which it produces is led into the apparatus (e.g. with the aid of suitable directing mirrors). This latter scenario is often the case when the source LA is an excimer laser. The present invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW and interferometer IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;

2. In scan mode, essentially the same scenario applies, except that a given target portion C is not exposed in a single "flash." Instead, the mask table MT is movable in a given direction (the so-called "scan direction", e.g., the Y direction) with a speed v, so that the beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
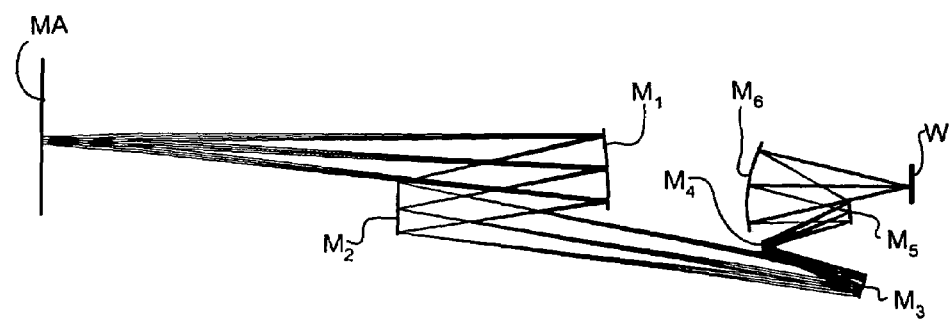
FIG. 2 depicts a reflector system of the projection system of the apparatus of FIG. 1.

FIG. 2 shows the mask MA, the projection system PL and the substrate W. The projection system PL comprises several reflectors, e.g. six reflectors $M_1$-$M_6$, which direct and focus the beam PB to project a reduced image of the mask pattern in mask MA onto the substrate W. The arrangement of reflectors in a projection system that may be used in the present invention in shown in FIG. 2. Further details of this, and other possible systems are given in U.S. Pat. No. 6,556,648. The positions and orientations of the reflectors, and particularly any changes therein, affect the position of the projected image and may also distort the image in other ways. For example, a shift in position of one or more reflectors can affect the magnification of the projected image. To minimize distortions and displacements of the projected image, which of course will result in errors in the device being manufactured, the reflectors are held in active mounts and their positions relative to the reference frame RF are thereby maintained as stable as possible. The positions of the mask MA and substrate W are also controlled relative to the reference frame RF.

However, in spite of this active control, undesirable errors and disturbances in the positions of the reflectors may occur and it is desirable to be able to detect these, and preferably correct or compensate for any resulting shift of the projected image and/or distortion in the projected image. Reflector alignment systems 10 and 20 are therefore provided. These systems use alignment beams AB1, AB2 which propagate through the projection system PL, being reflected by the reflectors of the projection system, to measure the apparent relative positions of marks 11, 21 provided on the mask side of the projection system PL and marks 14, 24 on the substrate side. Marks 11, 14, 21, 24 are fixed relative to each other and preferably to the reference frame RF. Any change in the position or orientation of a reflector in the projection lens will manifest itself as a change in the apparent relative position of the marks and is detected by the alignment systems 10, 20.

In this embodiment, the marks 11, 14, 21, 24 and folding mirrors 12, 13, 22, 23, which direct the alignment beams to and from the marks into the projection system PL, are positioned so that the mask side marks are in planes optically congruent with the object plane of the projection lens and the substrate side marks are in planes optically congruent with the image plane. With this arrangement, the shift in apparent position of the marks directly corresponds to the shift in the image projected on the substrate so the position error signal may be directly applied as a correction to the mask and/or substrate positions. In other arrangements a, possibly non-linear, transformation may need to be applied to the position error signal.

Figure 3:
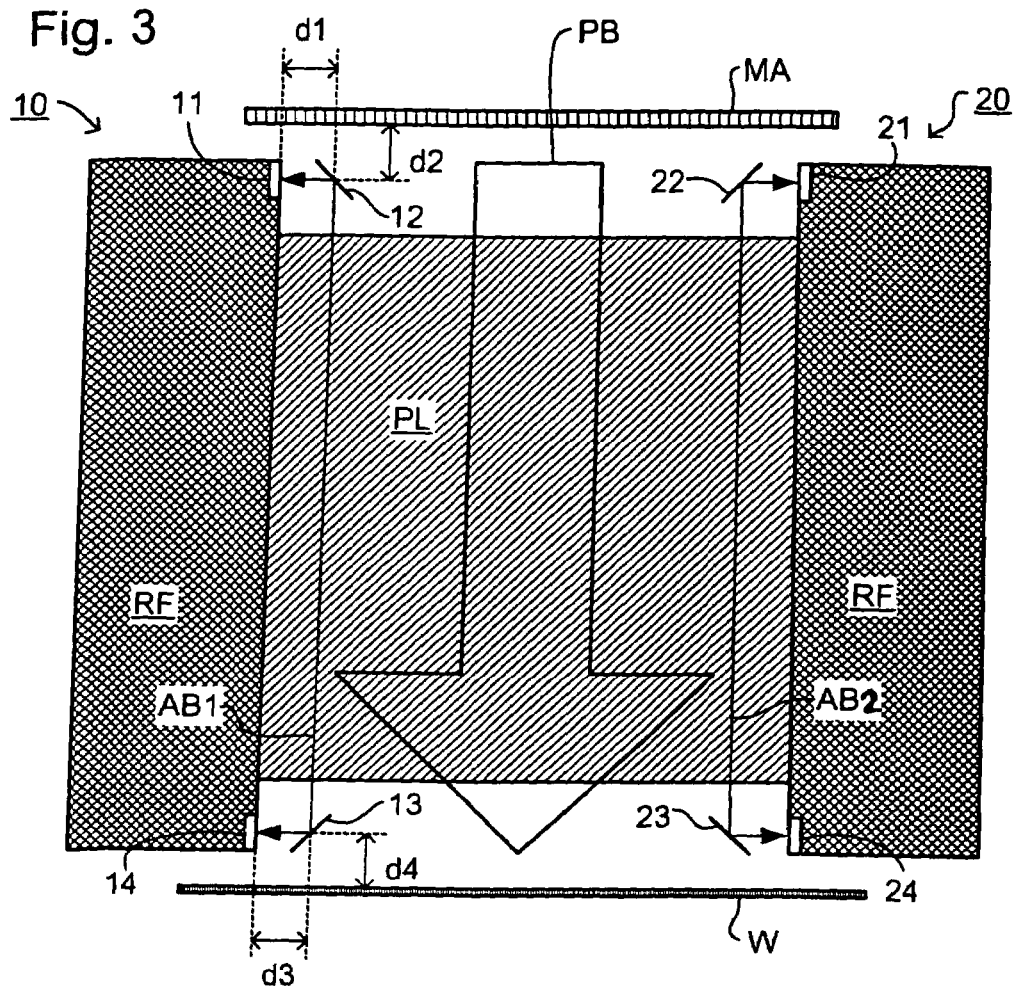
FIG. 3 depicts the projection system and reflector alignment system of the apparatus of FIG. 1.

As shown in FIG. 3, the optics of the alignment systems 10, 20 are such as to have a numeric aperture $NA_{AB}$ less than the numeric aperture $NA_{PB}$ of the apparatus 1. For example, $NA_{AB}$ may be about 0.05 while $NA_{PB}$ may be about 0.25. This means that the folding mirrors can be placed to direct the alignment beams AB1, AB2 to the marks without blocking part of the beam PB. In projection systems where mirror movements and/or rotations predominantly include a shift of the projected image, one reflector alignment system may suffice. However two reflector alignment systems can be used to additionally measure rotation and magnification changes while further systems allow measurement of higher order effects, e.g. third order distortions.

Figure 4:
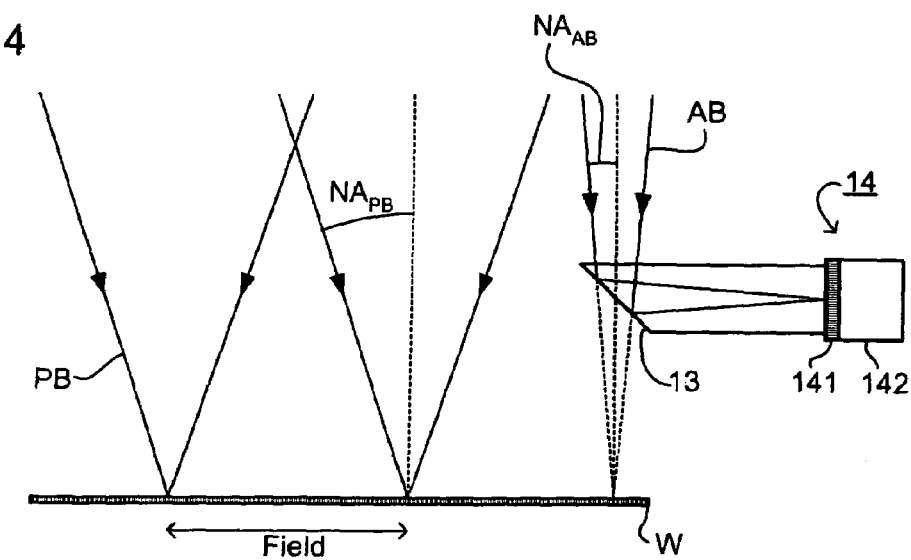
FIG. 4 is an enlarged view of the substrate and substrate side reference mark showing extreme rays of the projection and alignment beams.

FIG. 4 also shows that the folding mirror 13 may be formed as the angled end of a transparent rod, at the end of which is fixed mark 14, in this case comprising a grating 141 and photocell 142. Of course, the photodetector may be situated remotely and the radiation conducted to it by an optical fiber. Likewise, the source illuminating the first grating of the reflector alignment system may be situated remotely and the illumination radiation conducted to the appropriate place by optical fiber(s). This avoids the necessity to mount potentially heat-generating components on the reference frame, which must be maintained at a constant temperature. Furthermore, the positions of the source and detector may be interchanged.

The alignment systems 10, 20 may take various different forms and in particular may be adapted from an alignment system used to make through-the-lens (TTL) alignments between reference marks provided in the mask and on the substrate. In one such alignment system, the reference marks are formed as gratings and an image of one grating is projected onto the other. A photocell is positioned behind the second grating and the intensity of the signal output by it is monitored while the marks are scanned relative to one another. In the embodiment of the present invention which uses fixed marks it is not possible to perform such a relative scan. Instead, one of the marks can be formed by a running interference pattern between two inclined beams.

Figure 5:
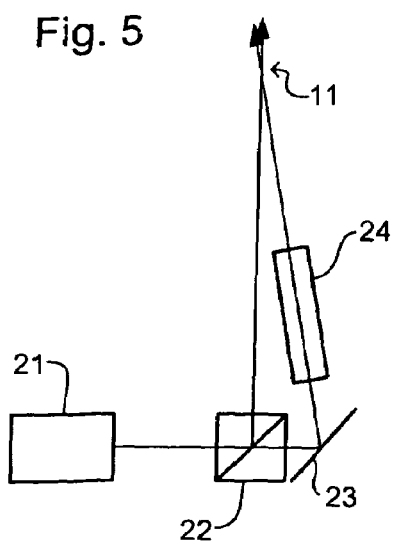
FIG. 5 is a diagram of an arrangement configured to generate a moving interference pattern as a reference mark.

FIG. 5 illustrates an arrangement for producing such an interference pattern. A coherent light source 21, e.g. a visible light laser, emits a beam which is split in two sub-beams by beam splitter 22. One sub-beam is then directed by folding mirror 23 through electro-acoustic modulator 24. An interference pattern is formed in the region of overlap and this forms one reference mark 11. The spacing of the interference pattern is determined by the wavelength of the radiation used and the angle of overlap between the two sub-beams. Electro-acoustic modulator 24 introduces a variable phase delay in one sub-beam which causes the interference pattern to move in a controllable fashion. Further information about such an arrangement is given in U.S. Pat. No. 5,485,272.

An alternative to a running interference pattern is to use a Zeeman laser which emits a beam containing two components of different wavelengths at a separation determined by the strength of a magnetic field applied to the laser cavity. The two components are circularly polarized with opposite senses and can therefore be separated using a polarizing beam splitter and caused to interfere using waveplates and polarizers or by ensuring that one component undergoes an odd number of reflections more than the other.

Figure 6:
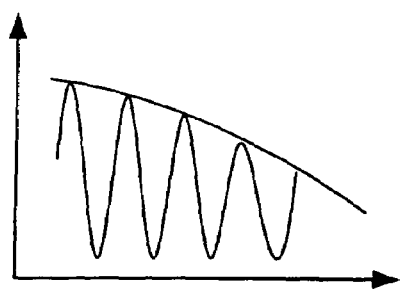
FIG. 6 depicts an intensity pattern detected in an embodiment of the present invention.

Another alignment system which does not need a relative scan of the gratings uses projection gratings of slightly different pitches. This results in a beat signal, like that shown in FIG. 6, which can be detected with a detector such as a CCD array. A phase change between the two gratings, e.g. caused by a relative displacement, results in a similar phase change in the beat signal. The phase change in the beat is easy to detect because it has a larger period.

A further alternative alignment system uses a modulation technique to enable a static or zero-measurement with low noise levels. For example, light incident on the detector grating is split into two equal components, using a direfringent material that separates the light into ordinary (o) and extraordinary (e) components. This results in two relatively displaced images of the projection grating on the detection grating. An optical modulator (e.g. working on the photo-elasticity principle) lies between the detection grating and the detector and alternately passes the o and e components. The difference between the o and e signals is related to the relative displacement between projection and detection gratings. This type of detector is further described in U.S. Pat. No. 4,251,160.

It should be noted that the wavelength of the alignment beams does not have to be the same as that of the beam. The reflectivities of reflectors in the projection system PL are optimized for the wavelength of the beam but the reflectors will still have reasonably high reflectivities at other wavelengths, e.g. visible and ultraviolet. Use of a sufficiently powerful source and a sensitive detector can ensure a useable signal even where there are very large losses in the projection system PL.

If a scanning mark is not necessary and the alignment system can cope with the losses, one of the marks can be replaced with a retro-reflector such as a cat's eye or corner cube so that the alignment beam makes two passes through the projection system, doubling the measurement accuracy.

Referring again to FIG. 1, the apparatus may further include a control unit, or controller, CU responsive to the reflector alignment systems 10, 20 configured to control a position of at least one of the patterning device (mask MA) and the substrate (W) to compensate for or alleviate errors detected by the reflector alignment system. The controller may control the fist and/or second positioning devices PM, PW to correct the position of the mask table and/or the substrate table.

While specific embodiments of the invention have been described above, it will be appreciated that the invention may be practiced otherwise than as described. The description is not intended to limit the invention. For example, the invention may be used in an apparatus having a catadioptric projection system instead of a wholly reflective projection system.

What is claimed is:

1. In a lithographic projection apparatus including an illuminator configured to provide a beam of radiation, a support configured to support a patterning device, the patterning device configured to pattern the beam according to a desired pattern, a substrate table configured to hold a substrate, and a projection system configured to project the patterned beam onto a target portion of the substrate, a reflector alignment system comprising:

reflectors which form part of the projection system; and first and second folding mirrors configured to direct an alignment beam of radiation through the projection system to and from a first reference mark provided in a fixed position on a patterning device side of the projection system and to and from a second reference mark provided in a fixed position on a substrate side of the projection system, wherein the first folding mirror is an angled end of a first transparent rod, wherein the first reference mark comprises a first grating at an end of the first transparent rod opposite the angled end, and wherein the reflector alignment system is configured to measure apparent relative positions of the first reference mark and the second reference mark.

2. A reflector alignment system according to claim 1, further comprising a photodetector configured to detect an image of the second reference mark projected onto the first grating.

3. A reflector alignment system according to claim 2, wherein the second reference mark comprises a second grating, the second grating having a different pitch than the first grating, and a phase change between the first and second gratings caused by a relative displacement of the first and second reference marks is detected by the photodetector as a beat signal.

4. In a lithographic projection apparatus including an illuminator configured to provide a beam of radiation, a support configured to support a patterning device, the patterning device configured to pattern the beam according to a desired pattern, a substrate table configured to hold a substrate, and a projection system configured to project the patterned beam onto a target portion of the substrate, a reflector alignment system comprising:

a coherent light source configured to emit a beam;

a beam splitter configured to split the beam into two beams; and a folding mirror configured to direct one of the two beams through an electro-acoustic modulator into a region of overlap with the other of the two beams at an intersecting angle, wherein the reflector alignment system is configured to direct an alignment beam of radiation through the projection system to measure apparent relative positions of a first reference mark provided in a fixed position on a patterning device side of the projection system and a second reference mark provided in a fixed position on a substrate side of the projection system, and wherein the second reference mark comprises a running fringe pattern formed by interference between the two beams at the intersecting angle.

5. In a lithographic projection apparatus including an illuminator configured to provide a beam of radiation, a support configured to support a patterning device, the patterning device configured to pattern the beam according to a desired pattern, a substrate table configured to hold a substrate, and a projection system configured to project the patterned beam onto a target portion of the substrate, a reflector alignment system comprising:

a reflector alignment system configured to direct an alignment beam of radiation through the projection system to measure apparent relative positions of a first reference mark provided in a fixed position on a patterning device side of the projection system and a second reference mark provided in a fixed position on a substrate side of the projection system, wherein one of the first or second reference marks comprises a retro-reflector configured to direct the alignment beam through the projection system a second time.

6. A lithographic projection apparatus, comprising:

an illumination system configured to provide a beam of radiation;

a support configured to support a patterning device, the patterning device being configured to pattern the beam of radiation according to a desired pattern;

a substrate table configured to hold a substrate;

a projection system configured to project the patterned beam onto a target portion of the substrate; and a reflector alignment system comprising:

reflectors which form part of the projection system; and first and second folding mirrors configured to direct an alignment beam of radiation through the projection system to and from a first reference mark provided in a fixed position on a patterning device side of the projection system and to and from a second reference mark provided in a fixed position on a substrate side of the projection system;

wherein the first folding mirror is an angled end of a first transparent rod, wherein the first reference mark comprises a first grating at an end of the first transparent rod opposite the angled end, and wherein the reflector alignment system is configured to measure apparent relative positions of the first reference mark and the second reference mark.

7. A lithographic projection apparatus according to claim 6, further comprising a photodetector configured to detect an image of the second reference mark projected onto the first grating.

8. A lithographic projection apparatus according to claim 7, wherein the second reference mark comprises a second grating, the second grating having a different pitch than the first grating, and a phase change between the first and second gratings caused by a relative displacement of the first and second reference marks is detected by the photodetector as a beat signal.

9. A lithographic projection apparatus according to claim 6, wherein the beam of radiation provided by the illumination system and the alignment beam of radiation have different wavelengths.

10. A lithographic projection apparatus, comprising:

an illumination system configured to provide a beam of radiation;

a support configured to support a patterning device, the patterning device being configured to pattern the beam of radiation according to a desired pattern;

a substrate table configured to hold a substrate;

a projection system configured to project the patterned beam onto a target portion of the substrate; and a reflector alignment system comprising:

reflectors which form part of the projection system;

a coherent light source configured to emit a beam;

a beam splitter configured to split the beam into two beams; and a folding mirror configured to direct one of the two beams through an electro-acoustic modulator into a region of overlap with the other of the two beams at an intersecting angle, wherein the reflector alignment system is configured to direct an alignment beam of radiation through the projection system to measure apparent relative positions of a first reference mark provided in a fixed position on a patterning device side of the projection system and a second reference mark provided in a fixed position on a substrate side of the projection system, and wherein the second reference mark comprises a running fringe pattern formed by interference between the two beams at the intersecting angle.

11. A lithographic projection apparatus, comprising:

an illumination system configured to provide a beam of radiation;

a support configured to support a patterning device, the patterning device being configured to pattern the beam of radiation according to a desired pattern;

a substrate table configured to hold a substrate;

a projection system configured to project the patterned beam onto a target portion of the substrate; and a reflector alignment system comprising reflectors which form part of the projection system and configured to direct an alignment beam of radiation through the projection system to measure apparent relative positions of a first reference mark provided in a fixed position on a patterning device side of the projection system and a second reference mark provided in a fixed position on a substrate side of the projection system, wherein one of the first or second reference marks comprises a retro-reflector configured to direct the alignment beam through the projection system a second time.

12. In a lithographic projection apparatus including an illuminator configured to provide a beam of radiation, a support configured to support a patterning device, the patterning device configured to pattern the beam according to a desired pattern, a substrate table configured to hold a substrate, and a projection system configured to project the patterned beam onto a target portion of the substrate, a reflector alignment system comprising:

reflectors which form part of the projection system; and first and second folding mirrors configured to direct an alignment beam of radiation through the projection system to and from a first reference mark provided in a fixed position on a patterning device side of the projection system and to and from a second reference mark provided in a fixed position on a substrate side of the projection system, wherein the reflector alignment system is configured to measure apparent relative positions of the first reference mark and the second reference mark.

13. A lithographic projection apparatus, comprising:

an illumination system configured to provide a beam of radiation;

a support configured to support a patterning device, the patterning device being configured to pattern the beam of radiation according to a desired pattern;

a substrate table configured to hold a substrate;

a projection system configured to project the patterned beam onto a target portion of the substrate; and a reflector alignment system comprising:

first and second folding mirrors configured to direct an alignment beam of radiation through the projection system to and from a first reference mark provided in a fixed position on a patterning device side of the projection system and to and from a second reference mark provided in a fixed position on a substrate side of the projection system, wherein the reflector alignment system is configured to measure apparent relative positions of the first reference mark and the second reference mark.

* * * * *